United States Patent [19]

Ishigaki et al.

[11] 3,983,505

[45] Sept. 28, 1976

[54] SIGNAL FREQUENCY BAND CONTROL SYSTEM

[75] Inventors: Yukinobu Ishigaki, Yamato; Takaro Mori, Yokohama, both of Japan

[73] Assignee: Victor Company of Japan, Limited, Yokohama, Japan

[22] Filed: Apr. 8, 1975

[21] Appl. No.: 566,072

[30] Foreign Application Priority Data

| Apr. 10, 1974 | Japan | 49-41424 |
| Apr. 15, 1974 | Japan | 49-40891 |
| Apr. 22, 1974 | Japan | 49-44423 |
| Apr. 22, 1974 | Japan | 49-44424 |

[52] U.S. Cl. ................. 330/107; 330/85; 330/86; 330/103; 330/109
[51] Int. Cl.² ......................... H03F 1/36
[58] Field of Search ......... 330/107, 109, 103, 149, 330/85, 86; 328/167; 333/14

[56] References Cited
UNITED STATES PATENTS

| 3,753,159 | 8/1973 | Burwen | 330/107 X |
| 3,815,039 | 6/1974 | Fujisawa et al. | 330/107 X |

OTHER PUBLICATIONS

Girling et al., "Active Filters", *Wireless World*, Mar. 1970, pp. 134-139.

*Primary Examiner*—James B. Mullins

[57] ABSTRACT

A signal frequency band control system comprises an amplifier for amplifying an input signal. A first differentiation or integration circuit receives an output signal from the amplifier and carries out a primary differentiation or primary integration. A second differentiation or integration circuit is supplied with an output signal from the amplifier and carries out a secondary differentiation or secondary integration. A first gain constant circuit multiplies the output signal from the second differentiation or integration circuit by a first gain constant. A second constant circuit multiplies, by a second gain constant, the signal resulting from the addition of the output signal of the first differentiation or integration circuit and the output signal of the first gain constant circuit. A circuit negatively feeds back, to the amplifier, a signal resulting from the addition of the output signal of the amplifier and the output signal of the second gain constant circuit. The gain constant of one of the first and second gain constant circuits is varied. The cutoff frequency of the frequency band of the output signal of the amplifier is varied in accordance with the variation of the gain constant thus varied.

14 Claims, 22 Drawing Figures

SIGNAL FREQUENCY BAND CONTROL SYSTEM

BACKGROUND OF THE INVENTION

The present invention relates generally to signal frequency band control systems and more particularly to a signal freqency band control system providing a high-pass filter or a low-pass filter of variable cut-off frequency. In particular, the system accomplishes an automatic gain control, as the frequency band is varied in accordance with the input signal level.

One prior example of a variable filter circuit capable of varying a signal filter frequency band, uses a variable filter circuit which has, for example, a variable inductance element connected between input and output points. A variable capacitance element and a resistance element are connected in parallel between a junction point of this variable inductance element and the output point and ground (earth). The filter circuit has a slope characteristic of 12 dB/oct.

This variable filter circuit has a characteristic with a variable cut-off frequency in the audio frequency band. For example, if a number of hundred Hz is to be obtained, a variable inductance element having an inductance measured in hundreds H must be used, when an ordinary variable capacitor having a capacitance value measured in hundreds of PF is used, as the variable capacitance element. This circuit has an extremely high cost. Furthermore, when a variable capacitance diode measured in tens of PF is used as the variable capacitance element, a variable inductance element of an extremely large inductance value must be used. In either case, the circuit is not practical.

As another known variable filter circuit, there has been one which has a first low-pass filter comprising a variable resistance element, and a variable capacitance element and a second low-pass filter comprising a variable resistance element and a variable capacitance element, connected in series, and which has a slope characteristic of 12 dB/oct.

This variable filter circuit uses at least two variable resistance elements and two variable capacitance elements. These elements must have a matched characteristic. It is difficult, however, to obtain these kinds of variable elements, with a matched characteristic. On the other hand, if the variable elements deviate in their characteristics, an ideal variable band characteristic cannot be obtained.

SUMMARY OF THE INVENTION

Accordingly, it is a general object of the present invention to provide a novel and useful signal frequency band control system, in which the above described difficulties have been overcome.

A specific object of the invention is to provide a signal band control system which provides a variable filter circuit capable of varying the cut-off frequency of a filter characteristic, with a slope of 12 dB/oct in the audio band. The filter is varied by changing the resistance value of a single variable resistance element.

Still another object of the invention is to provide a signal frequency band control system suitable for providing the above described filter, in an automatic gain control system, in which a variable band filter is used.

Other objects and further features of the invention will be apparent from the following detailed description, with respect to preferred embodiments of the invention, when read in conjunction with the accompanying drawings.

DETAILED DESCRIPTION

Figure 1:
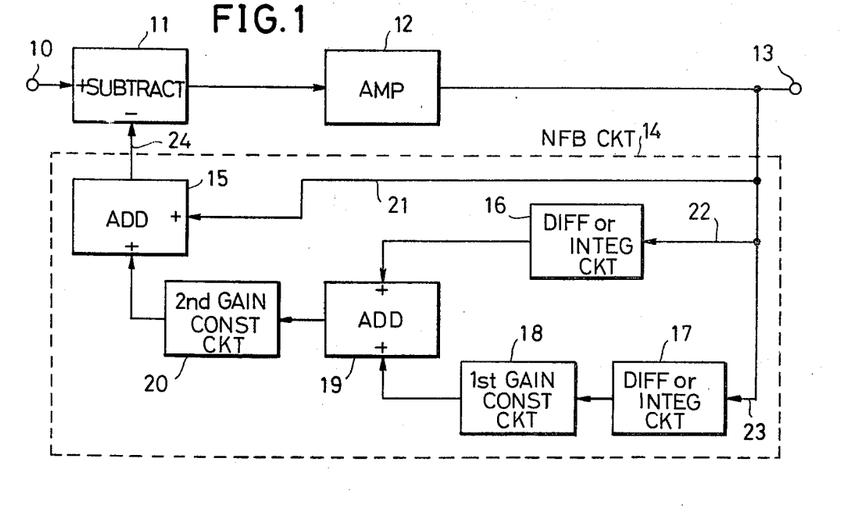
FIG. 1 is a block diagram showing a first embodiment of the signal frequency band control system, according to the invention.

FIG. 1 shows a first embodiment of the signal frequency band control system according to the invention. A signal is applied to an input terminal 10 of this system, together with a signal from a negative feed-back circuit 14 described hereinafter. These signals are applied to a subtracter 11, where subtraction is carried out. The resulting output deviation signal of the above mentioned two signals from the subtracter 11 is amplified by an amplifier 12 and is then applied to an output terminal 13.

The output signal of the amplifier 12 is supplied to a negative feedback circuit 14 and is supplied through the feedback paths 21, 22, and 23, respectively, to an adder 15 and differentiating or integrating circuits 16 and 17. The output of the circuit 16 is supplied, together with the output of the circuit 17, which has passed through a first constant circuit 18, to an adder 19, where these two outputs are added.

The output of the adder 19 is applied by way of a second constant circuit 20 to an adder 15. There, it is added to a signal from the negative feedback path 21. The output signal of the adder 15 is supplied by way of the negative feedback path 24 to the above mentioned subtracter 11.

In the above described circuit, a primary differentiation circuit is used for the circuit 16. A secondary differentiation circuit is used for the circuit 17. The entire circuit shown in FIG. 1 operates as a variable low-pass filter. On the other hand, when a primary integration circuit is used for the circuit 16 and a secondary integration circuit is used for the circuit 17, the circuit shown in FIG. 1, as a whole, operates as a variable high-pass filter.

Accordingly, next to be described is a variable low-pass filter comprising primary and secondary differentiation circuits which are respectively used for the circuits 16 and 17, together with their respective transfer functions.

In the following analysis, the gain of the amplifier 12 is denoted by A; the transfer function of the primary differentiation circuit 16 by $s$; the transfer function of the secondary differentiation circuit 17 by $s^2$; the gain constants of the constant circuits 18 and 22 by K1 and K2, respectively; the input signal by R(s); and the output signal by C(s).

The transfer function H(s) of the feedback circuit 14 can be expressed by the following equation;

$$H(s) = 1 + K2(s + K2\, s^2) = 1 + K2\, s + K1\, K2\, s^2 \quad (1)$$

When it is assumed that the gain A of the amplifier 12 is amply large ($A \gg 1$), the transfer function $Gl(s) = C(s)/R(s)$, between the input and output, is as follows:

$$Gl(s) = \frac{C(s)}{R(s)} \approx \frac{1}{1 + K2\, s + K1\, K2\, s^2}$$

$$= \frac{1}{1 + 2\zeta \left(\frac{1}{\omega_n}\right)s + \left(\frac{1}{\omega_n}\right)^2 s^2} \quad (2)$$

where $$\omega_n = \sqrt{\frac{1}{K1\, K2}}$$
$$\zeta = \frac{1}{2}\sqrt{\frac{K2}{K1}} \quad (3)$$

It is apparent that, the circuit shown in FIG. 1 possesses a low-pass filter characteristic under these conditions.

Next to be described is a filter wherein primary and secondary integration circuits are respectively used for the circuits 16 and 17. The gain of the amplifier 12 is denoted by A; the transfer function of the primary integration circuit 16 by $1/s$; the transfer function of the secondary integration circuit 17 by $1/s^2$; and the gain constants of the constant circuits 18 and 22 by K1 and K2, respectively. Then the transfer function H(s) of the feedback circuit 14 can be expressed by the following equation:

$$H(s) = 1 + K2\left(\frac{1}{s} + \frac{K1}{s^2}\right) = \frac{K1\, K2 + K2\, s + s^2}{s^2} \quad (4)$$

Accordingly, the transfer function Gh(s) between the input and output can be expressed as follows:

$$Gh(s) \approx \frac{s^2}{s^2 + K2\, s + K1\, K2} \quad (A \gg 1)$$

$$= \frac{s^2}{s^2 + 2\zeta\omega_n s + \omega_n^2} \quad (5)$$

Here, $$\omega_n = \sqrt{K1\, K2}$$
$$\zeta = \frac{1}{2}\sqrt{\frac{K2}{K1}} \quad (6)$$

It is apparent from this Eq.(5) that, this time the circuit shown in FIG. 1 has a high-pass filter characteristic.

As is apparent from the above Eqs. (3) and (6), if the constant K1 is made constant, and the constant K2 is made variable in the above mentioned low-pass filter or high-pass filter, the cut-off frequency of the filter will vary with the constant K2. Furthermore, the damping factor $\zeta$ does not conform to variations in the cut-off frequency, but also varies. Thus, the constant K1 is so selected that the damping factor $\zeta$ becomes a suitable value in a predetermined band.

When the constant K2 is made constant, and the constant K1 is made variable, the cut-off frequency of the filter becomes variable. In this case, the variation of the damping factor $\zeta$ becomes opposite of that mentioned above.

Figure 2:
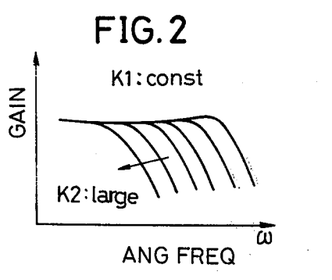
FIGS. 2 through 5 are graphs respectively indicating frequency characteristics in accordance with transfer functions, of the specific blocks in the system illustrated in FIG. 1.
Figure 3:
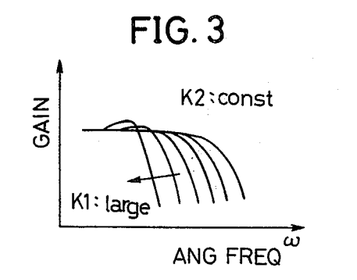

FIG. 2 shows the variable low-pass filter characteristic if the constant K1 is held constant, and the constant K2 is made variable in the low-pass filter. In this case, if the constant K2 is made larger, the cut-off frequency of the low-pass filter becomes lower. Furthermore, FIG. 3 shows the variable low-pass filter characteristic if the constant K2 is held constant, and the constant K1 is made variable. In this case, if the constant K1 is made larger, the cut-off frequency of the low-pass filter becomes lower.

Figure 4:
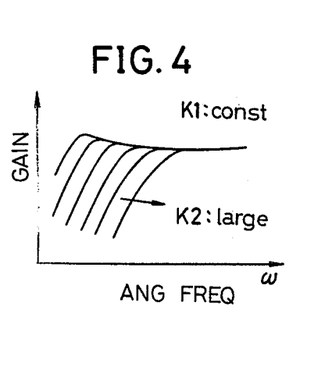
Figure 5:
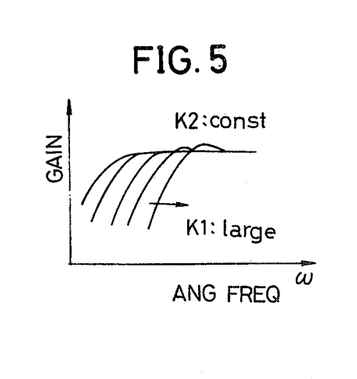

Similarly, the variable high-pass filter characteristic is as indicated in FIG. 4. In the high-pass filter, the constant K1 is made constant, and the constant K2 is made variable. In this case, if the constant K2 is made larger, the cut-off frequency of the high-pass filter is higher. Furthermore, the variable high-pass filter characteristic is as indicated in FIG. 5, if the constant K2 is held constant, and the constant K1 is made variable. In this case, if the constant K1 is made larger, the cut-off frequency of the high-pass filter becomes higher.

Figure 6:
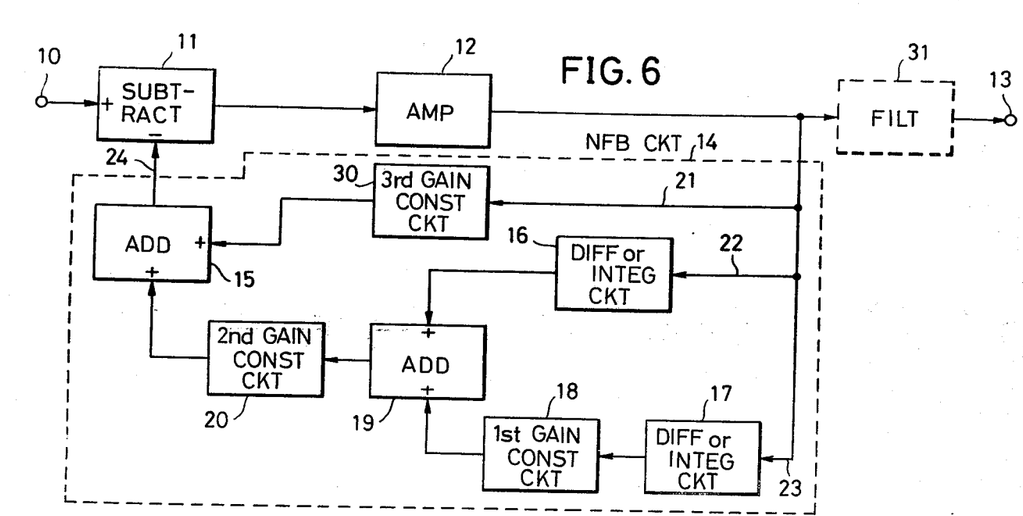
FIG. 6 is a block diagram showing a second embodiment of the signal frequency band control system, according to the invention.

FIG. 6 is a block diagram of a second embodiment of a variable signal frequency band control system, according to the invention. Those parts which are the same as corresponding parts in FIG. 1 are designated by the same reference numerals and characters. Detailed description of such parts will not be repeated.

First, the organization of the low-pass filter will be considered. A high-pass filter having a transfer function $s/(1 + s)$ is used for the primary differentiation circuit 16. A high-pass filter having a transfer function $s^2/(1 + s)^2$ is used for the secondary differentiation circuit 17. In the negative feedback path 21, in the feedback circuit 14, a third constant circuit 30 has a gain constant K3. Before the output terminal 13, a low-pass filter 31, having a transfer function $1/(1+s)^2$, may be provided in order to improve the frequency characteristic of the transfer function between input and output.

The transfer function H(s) of the feedback circuit 14 can be expressed by the following equation:

$$H(s) = K3 + K2 \left\{ \frac{s}{1+s} + \frac{K1\,s^2}{(1+s)^2} \right\}$$

$$= \frac{K3 + (2K3 + K2)s + \{K3 + K2(1 + K1)\}s^2}{(1+s)^2} \quad (7)$$

If the gain A of the amplifier 12 is relatively large, that is, $A \gg 1$, the input-output transfer function Gl(s) will be as follows:

$$Gl(s) = \frac{(1+s)^2}{K3 + (2K3 + K2)s + \{K3 + K2(1+K1)\}s^2}$$

$$= \frac{1}{K3} \cdot \frac{(1+s)^2}{1 + \left(\frac{2K3+K2}{K3}\right)s + \left\{\frac{K3+K2(1+K1)}{K3}\right\}s^2}$$

$$\equiv \frac{1}{K3} \cdot \frac{(1+s)^2}{1 + 2\zeta\left(\frac{1}{\omega_n}\right)s + \left(\frac{1}{\omega_n}\right)^2 s^2} \quad (8)$$

where $$\left.\begin{array}{l} \omega_n = \sqrt{\dfrac{K3}{K3 + K2(1+K1)}} \quad (\leq 1) \\[6pt] \zeta = \dfrac{2K3+K2}{2}\sqrt{\dfrac{1}{K3\{K3+K2(1+K1)\}}} \end{array}\right\} \quad (9)$$

As is apparent from the above Eq.(8), the circuit shown in FIG. 6, in this case, operates as a low-pass filter. In this connection, when s is made equal to $j\omega$, the following relationships are derived from Eq.(8).

$$\lim_{\omega \to 0} Gl(j\omega) = \frac{1}{K3}$$

$$\lim_{\omega \to \infty} Gl(j\omega) = \frac{1}{K3 + K1(1+K2)}$$

Furthermore, from Eq.(9), the cut-off frequency fc becomes as follows:

$$fc = \frac{1}{2\pi}\sqrt{\frac{K3}{K3+K2(1+K1)}}$$

It is apparent, therefore, that by making constants K1 and K3 constant and making constant K2 variable, or by making constants K2 and K3 constant and making constant K1 variable, the cut-off frequency of the low-pass filter can be made variable.

Figure 7:
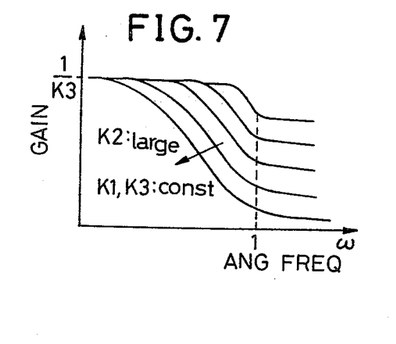
FIGS. 7 through 10 are graphs respectively indicating the frequency characteristics, in accordance with the transfer functions of the specific blocks in the system shown in FIG. 6.
Figure 8:
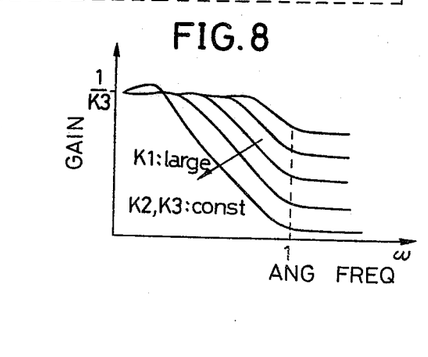

FIG. 7 shows the variable low-pass filter characteristic, if the constants K1 and K3 are made constant, and the constant K2 is made variable. In this case, if the constant K2 is made larger, the cut-off frequency becomes lower. Furthermore, FIG. 8 shows the variable low-pass filter characteristic if the constants K2 and K3 are held constant, and the constant K1 is made variable. In this case, the larger the constant K1 is, the lower the cut-off frequency becomes.

Next to be considered is the case of a high-pass filter. Here, a low-pass filter having a transfer function $1/(1+s)$ is used for the primary integration circuit 16. A low-pass filter having a transfer function $1/(1+s)^2$ is used for the secondary integration circuit 17. Furthermore, before the output terminal 13, a high-pass filter 31 having a transfer function $s^2/(1+s)^2$ may be provided.

The transfer function H(s) of the feedback circuit 14 can be expressed by the following equation:

$$H(s) = K3 + K2 \left\{ \frac{1}{1+s} + \frac{K1}{(1+s)^2} \right\}$$

$$= \frac{K3\,s^2 + (2K3 + K2)s + \{K3 + K2(1+K1)\}}{(1+s)^2} \quad (10)$$

Therefore, if $A \gg 1$, the transfer function Gh(s) between input and output will be as follows:

$$Gh(s) \approx \frac{(1+s)^2}{K3\,s^2 + (2K3+K2)s + \{K3+K2(1+K1)\}}$$

$$= \frac{1}{K3} \cdot \frac{(1+s)^2}{s^2 + \frac{2K3+K2}{K3}s + \frac{K3+K2(1+K1)}{K3}}$$

$$\equiv \frac{1}{K3} \cdot \frac{(1+s)^2}{s^2 + 2\zeta\omega_n s + \omega_n^2} \quad (11)$$

where $$\left.\begin{array}{l} \omega_n = \sqrt{\dfrac{K3+K2(1+K1)}{K3}} \quad (\geq 1) \\[6pt] \zeta = \dfrac{2K3+K2}{2\sqrt{K3\{K3+K2(1+K1)\}}} \end{array}\right\} \quad (12)$$

Accordingly, as is apparent from the above Eq.(11), the circuit illustrated in FIG. 6 operates in this case as a high-pass filter. Furthermore, it can be seen from Eq.(12) that by making constants K1 and K3 constant and making constant K2 variable, or by making constants K2 and K3 constant and making constant K1 variable, the cut-off frequency of the high-pass filter can be varied.

Figure 9:
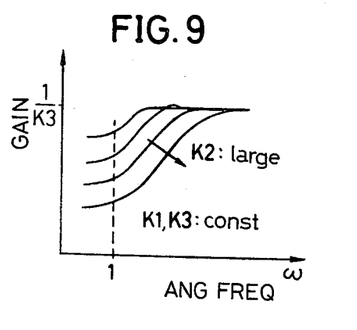
Figure 10:
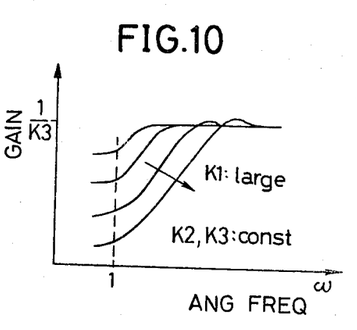

FIG. 9 shows the variable high-pass filter characteristic in the case where constants K1 and K3 are held constant and constant K2 is made variable. In this case, if the constant K2 is made greater, the cut-off frequency becomes higher. Furthermore, FIG. 10 shows the variable high-pass filter characteristic in the case where constants K2 and K3 are held constant and constant K1 is made variable. In this case, if the constant K1 is made greater, the cut-off frequency becomes higher.

The characteristics indicated in FIGS. 7 through 10 occur when the filter 31 is not provided.

By selecting the gain constant K3 of the constant circuit 30 at a value less than unity, a gain can be obtained between the input and output terminals 10 and 13. At the same time, the range of the variation of the cut-off frequency can be made large. Furthermore, by appropriately selecting the constant K1 in the case where the constant K2 is made variable and, conversely, by appropriately selecting the constant K2 in the case where the constant K1 is made variable, an optimum damping factor $\zeta$ can be obtained.

Figure 11:
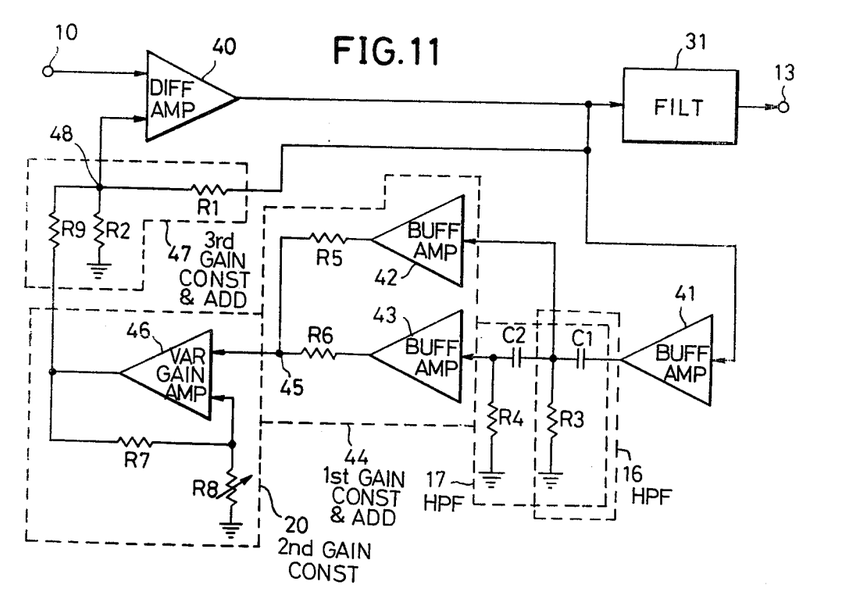
FIG. 11 is circuit diagram of one embodiment of a variable filter circuit in which the second embodiment system shown in FIG. 6 is applied in specific and concrete form.

Next to be described is one embodiment of a variable filter circuit resulting from a reduction of the system illustrated in FIG. 6 into a concrete form which constitutes a second embodiment of the invention (FIG. 11).

In this circuit shown in FIG. 11, an audio signal applied to the input terminal 10 is differentially amplified with a signal described hereinafter, by a differential amplifier 40. Thereafter, the signal passes through the low-pass filter 31, and is led to the output terminal 13. This differential amplifier 40 corresponds to the subtractor 11 and the amplifier 15 shown in FIG. 6.

The output of the differential amplifier 40 passes through resistors R1 and R2 in a circuit 47, corresponding to the gain constant circuit 30 and the adder 15 in FIG. 6. At a junction point 48, the resulting signal is added to a signal described hereinafter. Thereafter, it is negatively fed back to the input side of the differential amplifier 40.

At the same time, the output of the differential amplifier 40 passes through a buffer amplifier 41 and is supplied to a buffer amplifier 42 via a high-pass filter comprising a capacitor C1 and a resistor R3, corresponding to the primary differentiation circuit 16. Furthermore, the output of the buffer amplifier 41 is supplied to a buffer amplifier 43 via a high-pass filter, comprising capacitors C1 and C2 and resistors R3 and R4, corresponding to the secondary differentiation circuit.

The outputs of the buffer amplifiers 42 and 43, respectively, pass through mixing resistors R5 and R6 and are added at a junction point 45. The resulting output is thereafter supplied to a variable gain amplifier 46. A circuit 44 comprises the buffer amplifiers 42 and 43 and the resistors R5 and R6. This circuit 44 corresponds to the gain constant circuit 18 and the adder 19. The gain constant K1 of the gain constant circuit 18 is determined by the resistance ratio of the resistors R5 and R6.

A resistor R7 and a variable resistor R8 are connected to the variable gain amplifier 46. By varying the variable resistor R8, the gain constant K2 of the gain constant circuit 20 is varied. The output signal of the variable gain amplifier 46 passes through a resistor R9 in the circuit 47 and reaches the point 48. There it is added to a signal from the aforementioned resistor R1. The resulting signal is negatively fed back to the input side of the differential amplifier 40.

The above described circuit exhibits a frequency characteristic as indicated in FIG. 7, as mentioned above, if the low-pass filter circuit 31 is not used. As is apparent from FIG. 7, the characteristic becomes level at frequencies higher than $\omega = 1$. However, a low-pass filter 31 compensates for this characteristic if it has a transfer function $1/(1+s)^2$, a cut-off angular frequency $\omega_c = 1$, and a slope characteristic 12 dB/oct., as shown in FIG. 11.

The transfer function $Gl'(s)$ between input and output can be expressed by the following equation.

$$Gl'(s) = \frac{1}{K3} \cdot \frac{1}{1 + 2\zeta(\frac{1}{\omega n})s + (\frac{1}{\omega n})^2 s^2} \quad (13)$$

Figure 12:
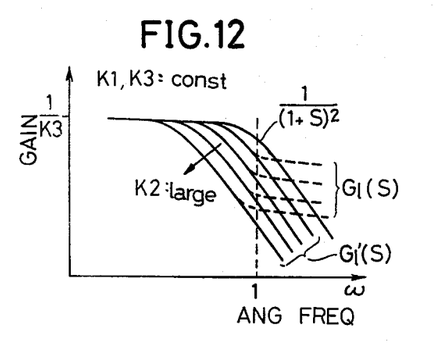
FIGS. 12 and 13 are graphs respectively indicating the frequency characteristics resulting from compensation of the characteristics indicated in FIGS. 7 and 9.

Therefore, the characteristic of $Gl'(s)$ becomes fully a low-pass filter characteristic as indicated in FIG. 12.

In place of the primary and secondary differentiation circuits 16 and 17, primary and secondary integration circuits, constituting low-pass filters, are used. The frequency characteristic of FIG. 9 is exhibited, as mentioned above. In this case, the characteristic becomes level at frequencies lower than $\omega = 1$. However, a high-pass filter is used to compensate for this characteristic, similarly as mentioned above. The high-pass filter has a transfer function $s^2/(1+s)^2$, a cut-off angular frequency $\omega_c = 1$, and a slope characteristic of 12 dB/oct.

The transfer function $Gh'(s)$ between input and output, in this case, can be represented as follows:

$$Gh'(s) = \frac{1}{K3} \cdot \frac{s^2}{s^2 + 2\zeta\omega ns + \omega n^2} \quad (14)$$

Figure 13:
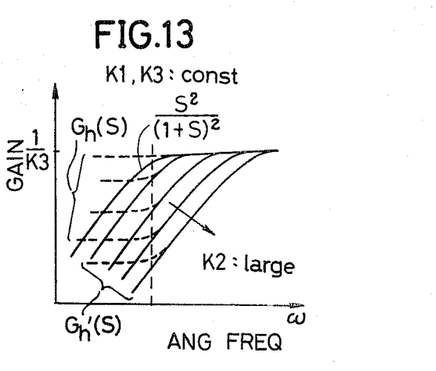

Therefore, the characteristic of $Gh'(s)$ becomes fully a high-pass filter characteristic, as indicated in FIG. 13.

Figure 14:
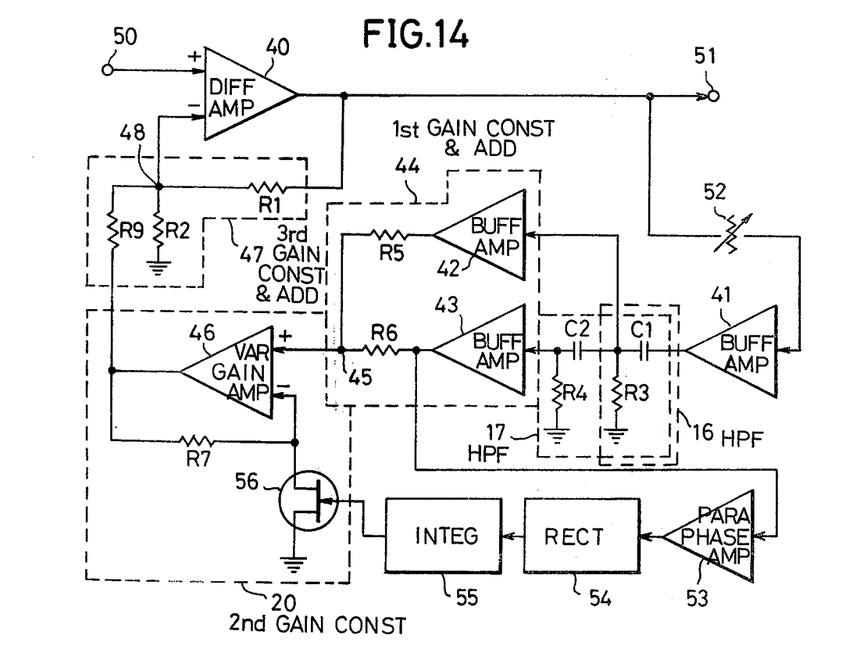
FIG. 14 is a circuit diagram showing one embodiment of an automatic gain control system in which the circuit shown in FIG. 11 is used.

Next to be described is one embodiment (FIG. 14) of an automatic gain control system using the circuit shown in FIG. 11. In FIG. 14, parts which are equivalent to corresponding parts in FIG. 11 are designated by like reference numerals and characters. A detailed description of such parts will not be repeated.

An audio signal is introduced through an input terminal 50 and differentially amplified with a signal from the circit 47, by the differential amplifier 40. The resulting signal is led out through an output terminal 51.

On one hand, this output signal of the differential amplifier 40 is supplied also to the circuit 47 and is negatively fed back. On still another hand, it is also supplied by way of a variable resistor 52 to the buffer amplifier 41. The output of this buffer amplifier 41 is passed through the high-pass filter 16 which corresponds to a primary differentiation circuit and then through the high-pass filter 17 corresponds to a secondary differentiation circuit. These circuits are respectively connected through buffer amplifiers 42 and 43 and resistors R5 and R6 of the circuit 44, to give the gain constant K1. The resulting signal is supplied to the positive input terminal of the variable gain amplifier 46 in the gain constant circuit 20.

A field-effect transistor (FET) 56 is connected between the negative input terminal of the variable gain amplifier 46 and ground (earth) resistor R7 is connected between this negative input terminal and the output terminal.

Furthermore, one portion of the output of the buffer amplifier 43, in the circuit 44, passes successively through a paraphase amplifier 53, a full-wave rectifier 54, and an integrator 55. As a consequence, the integrator 55 provides a control voltage equivalent to a detected envelope of the input audio signal. This control voltage is impressed on the gate of the FET 56, the internal resistance of which varies in accordance with this control voltage. Accordingly, the gain of the variable gain amplifier 46 is controllably varied in accordance with the resistance variation of the FET 56. The gain constant K2 of the circuit 20 is controllably varied in accordance with the input signal level. In this embodiment, when the level of the input signal entering through the input terminal 50 increases, the gain of the variable gain amplifier 46 increases.

The circuit 47 adds the output of the variable gain amplifier 46 with a signal from the differential amplifier 40, giving the gain constant K3. The resulting signal is negatively fed back to the differential amplifier 40.

Figure 15:
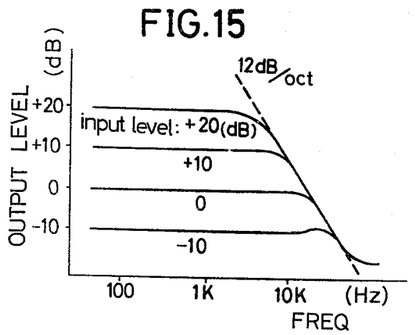
FIG. 15 is a graph indicating a frequency characteristic of the circuit shown in FIG. 14.

At the output terminal 51, there appears a signal in which the cut-off frequency has a low-pass filter characteristic having a slope of 12 dB/oct. This signal is automatically controlled in accordance with the input signal level, which is derived as indicated in FIG. 15.

In the above described embodiment, one portion of the output of the buffer amplifier 43 is supplied to the paraphase amplifier 53 in order to obtain the control voltage for the FET 56. The circuit arrangement need not be so limited. This is, for example, one portion of the signal at the addition point 45 may be led out to provide the above mentioned control voltage.

Figure 16:
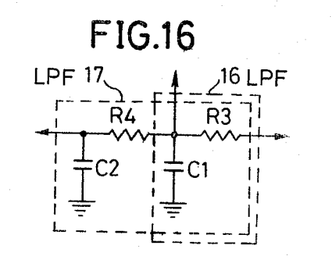
FIG. 16 is a circuit diagram showing another embodiment of a circuit constituting a modification of a part of the circuit shown in FIG. 14.
Figure 17:
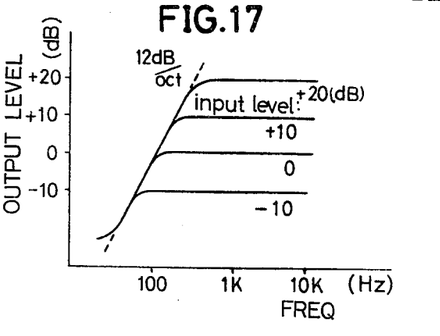
FIG. 17 is a graph indicating a frequency characteristic in the case where the circuit part shown in FIG. 16 is used in the circuit shown in FIG. 14.

If low-pass filters 16 and 17 are used as primary and secondary integration circuits, shown in FIG. 16 in place of the high-pass filters 16 and 17, as the above described primary and secondary differentiation circuits shown in FIG. 14, a signal is obtained in which the cut-off frequency of a high-pass filter characteristic has a slope of 12 dB/oct and is automatically controlled in accordance with the input signal level. This signal is led out from the output terminal 51, as indicated in FIG. 17.

Through the use of the automatic gain control system as described above, the cut-off frequency of a low-pass or high-pass filter can be automatically varied and controlled in accordance with the level of the input signal. This variation and control is accomplished by a single variable resistance element (FET 56, for example). Furthermore, by selecting a high value gain of the variable gain amplifier 46, the level of the voltage impressed on the gate of the FET 56 can be made low. The level of a signal generated between the drain and source thereof becomes low, and the nonlinear distortion thereof can be reduced. Furthermore, since the FET is used within a negative feedback loop, little distortion occurs.

Figure 19A:
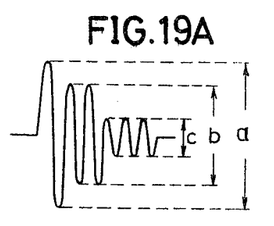
FIGS. 19A through 19D are diagrams respectively indicating signal levels for a description of the automatic gain control system shown in FIG. 18.
Figure 19B:
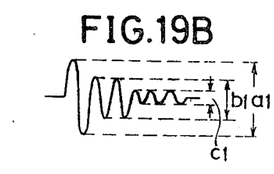

One embodiment of an application of the above described automatic gain control system will now be described. When the limiting of the input signal is accomplished by means of a peak limiting system known heretofore, the output signal (with respect to an input signal of a waveform as indicated in FIG. 19A, for example), becomes as indicated in FIG. 19B. The levels $a$, $b$, and $c$ of the signal of FIG. 19A respectively become as indicated by levels a1, b1, and c1 in FIG. 19B. Here, the level a1 is a specific maximum limiting level. Then, by this known system, the low level $c$ drops to an even lower level c1. For this reason, if the signal is an audio signal, there is an extreme decrease in the sensation of volume, which has been a drawback in this known system.

Figure 18:
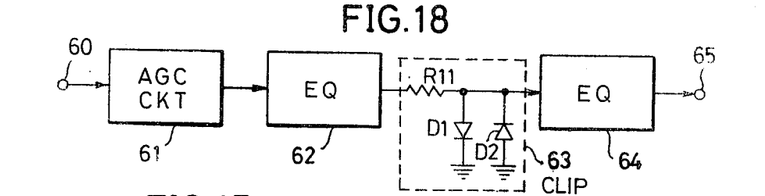
FIG. 18 is a block diagram indicating an embodiment of use of the automatic gain control system illustrated in FIG. 14.
Figure 19C:
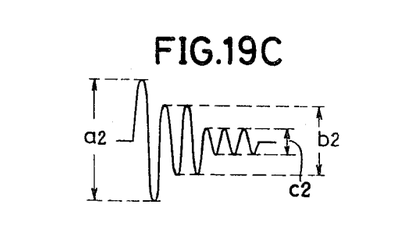

Accordingly, in the system illustrated in FIG. 18, this drawback is eliminated. A signal as indicated in FIG. 19A, is introduced through an input terminal 60 and supplied to an automatic gain control circuit 61, for example, as shown in FIG. 14. There it is subjected to automatic gain control as described above and made a signal of a level as indicated in FIG. 19C. The level a2 is lower than the level $a$, and higher than the above mentioned level a1. Accordingly, while the medium and low levels b2 and c2 are slightly lower than the levels $b$ and $c$, they are higher than the above mentioned levels b1 and c1.

Figure 19D:
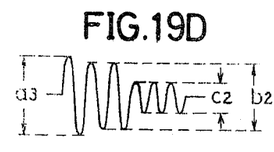

The output signal of the automatic gain control circuit 61 is supplied to an equalizer (high-boost circuit) 62 for compensating for a deterioration of frequency characteristic in a high frequency band due to a clipper described hereinafter. The high frequency band component of this signal is boosted somewhat by this equalizer 62. The equalizer 62 thus produces an output signal which is supplied to a clipper 63 comprising a resistor R11 and diodes D1 and D2 connected in parallel with mutually oppositely directed polarities. The peak portion of the signal is clipped. As a result, the signal is given one level as indicated in FIG. 19D. Here, the peak level a3 is made equal to the above mentioned specific level a1.

Accordingly, the clipper 63 provides a signal of a level relationship wherein the peak level a3 is limited at a value equal to the specific level a1. The medium and low levels are left at levels b2 and c2 which are higher than the above mentioned levels b1 and c1, as indicated in FIG. 19D. Therefore, since a signal of low level does not drop in level as in the prior art, the signal has an ample volume, to the sense of hearing.

The output signal of the clipper 63 is supplied to an equalizer (high-cut circuit) 64, where the high band component, boosted by the above mentioned equalizer 62, is suppressed and corrected and is thereafter led out through an output terminal 65.

Further, this invention is not limited to these embodiments but various variations and modifications may be made without departing from the scope and spirit of the invention.

What is claimed is:

1. A signal frequency band control system comprising:
    amplifier means for amplifying input signals having a certain frequency band;
    first differentiation circuit means responsive to an output signal of said amplifier means for providing a primary differentiation;
    second differentiation circuit means responsive to the output signal of said amplifier means for providing a secondary differentiation;
    first gain constant circuit means for multiplying the output signal of said second differentiation circuit means by a first gain constant K1;
    adding means for adding the output signals of said first differentiation circuit means and of said second differentiation circuit means after being multiplied by the first gain constant K1;
    second gain constant circuit means for multiplying the output signal of said adding means by a second gain constant K2 which is variable;
    control means for varying the second gain constant K2 to control the cut-off frequency of the frequency band of the output signal of said amplifier means; and
    feedback means for negatively feeding back to an input of said amplifier means a sum signal resulting from the addition of the output signal of said second gain constant circuit means and the output signal of said amplifier means.

2. A signal frequency band control system as claimed in claim 1 in which said first differentiation circuit means comprises a first high-pass filter having a transfer function $s$, and said second differentiation circuit means comprises a second high-pass filter having a transfer function $s^2$.

3. A signal frequency band control system as claimed in claim 1 which further comprises third gain constant circuit means for multiplying the output signal of said amplifier means by a third gain constant K3, and said feedback means negatively feeding back to the input of said amplifier means a sum signal resulting from the addition of the output signal of said second gain constant circuit means and the output signal of said third gain constant circuit means.

4. A signal frequency band control system as claimed in claim 3 in which said first differentiation circuit means comprises a first high-pass filter having a transfer function $s/(1 + s)$, and said second differentiation circuit means comprises a second high-pass filter having a transfer function $s^2/(1+s)^2$.

5. A signal frequency band control system as claimed in claim 4 which further comprises low-pass filter means having a transfer function $1/(1+s)^2$ and being coupled to the output side of said amplifier means.

6. A signal frequency band control system as claimed in claim 1 in which said second gain constant circuit means comprises a variable gain amplifier including a transistor, and said control means varying the internal resistance of the transistor responsive to the level of the output signal of said second differentiation circuit means and controlling the gain of said variable gain amplifier.

7. A signal frequency band control system as claimed in claim 1 in which said second gain constant circuit means comprises a variable gain amplifier including a transistor, and said control means varying the internal resistance of the transistor responsive to the level of the output signal of said adding means and controlling the gain of said variable gain amplifier.

8. A signal frequency band control system comprising:
   amplifier means for amplifying input signals having a certain frequency band;
   first integration circuit means responsive to an output signal of said amplifier means for providing a primary integration;
   second integration circuit means responsive to the output signal of said amplifier means for providing a secondary integration;
   first gain constant circuit means for multiplying the output signal of said second integration circuit means by a first gain constant K1;
   adding means for adding the output signals of said first integration circuit means and of said second integration circuit means after being multiplied by the first gain constant K1;
   second gain constant circuit means for multiplying the output signal of said adding means by a second gain constant K2 which is variable;
   control means for varying the second gain constant K2 to control the cut-off frequency of the frequency band of the output signal of said amplifier means; and
   feedback means for negatively feeding back to an input of said amplifier means a sum signal resulting from the addition of the output signal of said second gain constant circuit means and the output signal of said amplifier means.

9. A signal frequency band control system as claimed in claim 8 in which said first integration circuit means comprises a first low-pass filter having a transfer function $1/s$, and said second integration circit means comprises a second low-pass filter having a transfer function $1/s^2$.

10. A signal frequency band control system as claimed in claim 8 which further comprises third gain constant circuit means for multiplying the output signal of said amplifier means by a third gain constant K3, and said feedback means negatively feeding back to the input of said amplifier means a sum signal resulting from the addition of the output signal of said second gain constant circuit means and the output signal of said third gain constant circuit means.

11. A signal frequency band control system as claimed in claim 10 in which said first integration circuit means comprises a first low-pass filter means having a transfer function $1/(1+s)$, and said second integration circuit means comprises a second low-pass filter having a transfer function $1/(1+s)^2$.

12. A signal frequency band control system as claimed in claim 11 which further comprises high-pass filter means having a transfer function $s^2/(1+s)^2$ and being coupled to the output side of said amplifier means.

13. A signal frequency band control system as claimed in claim 8 in which said second gain constant circuit means comprises a variable gain amplifier including a transistor, and said control means varying the internal resistance of the transistor responsive to the level of the output signal of said second integration circuit means and controlling the gain of said variable gain amplifier.

14. A signal frequency band control system as claimed in claim 8 in which said second gain constant circuit means comprises a variable gain amplifier including a transistor, and said control means varying the internal resistance of the transistor responsive to the level of the output signal of said adding means and controlling the gain of said variable gain amplifier.

* * * * *